United States Patent
Jeganathan et al.

(10) Patent No.: US 9,985,655 B2
(45) Date of Patent: *May 29, 2018

(54) GENERATING ECC VALUES FOR BYTE-WRITE CAPABLE REGISTERS

(71) Applicant: International Business Machines Corporation, Armonk, NY (US)

(72) Inventors: Dhivya Jeganathan, Austin, TX (US); Dung Q. Nguyen, Austin, TX (US); Jose A. Paredes, Austin, TX (US); David R. Terry, Austin, TX (US); Brian W. Thompto, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 63 days.

This patent is subject to a terminal disclaimer.

(21) Appl. No.: 14/842,563

(22) Filed: Sep. 1, 2015

(65) Prior Publication Data
US 2017/0060679 A1    Mar. 2, 2017

(51) Int. Cl.
G11C 29/52     (2006.01)
G06F 11/10     (2006.01)
G11C 29/00     (2006.01)
H03M 13/29     (2006.01)
G11C 29/04     (2006.01)

(52) U.S. Cl.
CPC ..... *H03M 13/2906* (2013.01); *G06F 11/1056* (2013.01); *G06F 11/1064* (2013.01); *G11C 2029/0411* (2013.01)

(58) Field of Classification Search
None
See application file for complete search history.

(56) References Cited

U.S. PATENT DOCUMENTS

| | | |
|---|---|---|
| 3,573,728 A | 4/1971 | Kolankowsky et al. |
| 3,814,921 A | 6/1974 | Nibby et al. |
| 4,817,095 A | 3/1989 | Smelser et al. |

(Continued)

FOREIGN PATENT DOCUMENTS

JP      02222047 A    9/1990

OTHER PUBLICATIONS

U.S. Appl. No. 14/868,544, entitled Generating ECC Values for Byte-Write Capable Registers, filed Sep. 29, 2015.

(Continued)

*Primary Examiner* — Justin R Knapp
(74) *Attorney, Agent, or Firm* — Patterson + Sheridan, LLP

(57) ABSTRACT

Embodiments described herein include a computing system that permits partial writes into a memory element—e.g., a register on a processor. For example, the data to be written into the memory element may be spread across multiple sources. The register may receive data from two different sources at different times and perform two separate partial write commands to store the data. Embodiments herein generate an ECC value for each of the partial writes. That is, when storing the data of the first partial write, the computing system generates a first ECC value for the data in the first partial write and stores this value in the memory element. Later, when performing the second partial write, the computing system generates a second ECC value for this data which is also stored in the memory element.

11 Claims, 5 Drawing Sheets

(56) References Cited

U.S. PATENT DOCUMENTS

| | | | |
|---|---|---|---|
| 4,888,773 A | 12/1989 | Arlington et al. | |
| 4,918,695 A | 4/1990 | Scheuneman et al. | |
| 5,459,842 A * | 10/1995 | Begun | G06F 13/1631 710/68 |
| 6,502,218 B1 | 12/2002 | George et al. | |
| 6,971,041 B2 | 11/2005 | DeSota et al. | |
| 7,051,168 B2 | 5/2006 | Gschwind et al. | |
| 7,124,348 B2 * | 10/2006 | Nicolaidis | G06F 21/558 714/767 |
| 7,127,643 B2 | 10/2006 | Tremblay et al. | |
| 7,219,271 B2 | 5/2007 | Kleveland et al. | |
| 7,337,352 B2 | 2/2008 | DeSota | |
| 7,730,346 B2 | 6/2010 | Kroesche et al. | |
| 8,370,585 B2 | 2/2013 | Ukai | |
| 8,732,550 B2 * | 5/2014 | Ohnuki | G06F 9/30105 714/755 |
| 8,898,541 B2 | 11/2014 | Okubo et al. | |
| 9,003,260 B2 * | 4/2015 | Langadi | G06F 11/1048 714/758 |
| 9,116,824 B2 | 8/2015 | Sharon et al. | |
| 9,135,112 B2 | 9/2015 | Chen et al. | |
| 9,189,329 B1 | 11/2015 | Zhu et al. | |
| 9,218,240 B2 | 12/2015 | Chambers et al. | |
| 2002/0029365 A1 | 3/2002 | Sato et al. | |
| 2007/0220401 A1 | 9/2007 | Bains | |
| 2009/0276587 A1 | 11/2009 | Moyer et al. | |
| 2011/0055647 A1 | 3/2011 | Maeda et al. | |
| 2012/0151299 A1 | 6/2012 | Suh | |
| 2012/0324314 A1 | 12/2012 | Seshadri et al. | |
| 2013/0007574 A1 * | 1/2013 | Langadi | G06F 13/1673 714/807 |
| 2013/0139029 A1 | 5/2013 | Pawlowski | |
| 2014/0089602 A1 | 3/2014 | Biswas et al. | |
| 2014/0089760 A1 * | 3/2014 | Schmidt | G06F 11/1044 714/766 |
| 2014/0331101 A1 | 11/2014 | Chung et al. | |
| 2015/0363262 A1 * | 12/2015 | Hu | G06F 11/1044 714/773 |
| 2016/0139837 A1 | 5/2016 | Welker et al. | |
| 2017/0060677 A1 | 3/2017 | Jeganathan et al. | |
| 2017/0060678 A1 | 3/2017 | Jeganathan et al. | |
| 2017/0063401 A1 | 3/2017 | Jeganathan et al. | |

OTHER PUBLICATIONS

U.S. Appl. No. 14/868,660, entitled Processor Instruction Sequence Translation, filed Sep. 29, 2015.

IBM et al., Modified Error Correction Code Design to Allow Partial Word Writing to Memory Locations Which Contain Double Bit Errors: An IP.com Prior Art Database Technical Disclosure, Feb. 18, 2005, p. 1, ip.com, Fairport, United States.

Software Patent Institute et al., A low power video compression chip for portable applications: An IP.com Prior Art Database Technical Disclosure, Sep. 15, 2005, pp. 1-7, ip.com, Fairport, United States.

Chen, P. et al., Generalization of an Enhanced ECC Methodology for Low Power PSRAM, IEEE Transactions on Computers, vol. 62, No. 7, Jul. 2013, pp. 1318-1331, IEEE, Piscataway, United States.

Disclosed Anonymously, Method and System for Calculating Length of a Contiguous Data Block: An IP.com Prior Art Database Technical Disclosure, Oct. 8, 2010, pp. 1-2, ip.com, Fairport, United States.

Disclosed Anonymously, Method for an ECC implementation for register files on high-performance microprocessors: An IP.com Prior Art Database Technical Disclosure, Oct. 24, 2006, 3 pages, ip.com, Fairport, United States.

IBM "List of IBM Patents or Patent Applications Treated As Related".

U.S. Appl. No. 14/842,521, entitled Partial EEC Handling for a Byte-Write Capable Register, filed Sep. 1, 2015.

U.S. Appl. No. 14/824,410, entitled Processor Instruction Sequence Translation, filed Aug. 12, 2015.

* cited by examiner

GENERATING ECC VALUES FOR BYTE-WRITE CAPABLE REGISTERS

BACKGROUND

The present invention relates to partial register writes, and more specifically, to generating error correction codes for the partial writes.

In a processor, data may be partially written in storage because only a portion of the data is available. When the remaining portion of data becomes available, the data already in storage is read out, merged with the incoming data, and then rewritten into storage as a full set of data. However, this operation (i.e., a read-modify-write) is inefficient and complex.

SUMMARY

One embodiment of the present invention is an integrated circuit that includes a memory comprising a plurality of registers where each register includes a data entry, a first error correction code (ECC) entry, and second ECC entry. The integrated circuit also includes logic configured to, in response to receiving a first partial write request, store, in a first register of the plurality of registers, (i) a first ECC value generated using data in the first partial write request in the first ECC entry and (ii) the data of the first partial write request in the data entry, wherein the data of the first partial write request only partially fills the data entry. The logic is also configured to, in response to receiving a second partial write request, store, in the first register, (i) a second ECC value generated using data in the second partial write request in the second ECC entry and (ii) the data of the second partial write request in the data entry, wherein a combination of the data of the first and second partial write requests fills the data entry.

Another embodiment of the present invention is a computer program product for managing a memory comprising a plurality of registers, each register comprising a data entry, a first ECC entry, a second ECC entry. The program product includes computer-readable program code executable by one or more computer processors to, in response to receiving a first partial write request, store, in a first register of the plurality of registers, (i) a first ECC value generated using data in the first partial write request in the first ECC entry and (ii) the data of the first partial write request in the data entry, wherein the data of the first partial write request only partially fills the data entry. The program code is executable to store, in response to receiving a second partial write request, store, in the first register, (i) a second ECC value generated using data in the second partial write request in the second ECC entry and (ii) the data of the second partial write request in the data entry, wherein a combination of the data of the first and second partial write requests fills the data entry.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
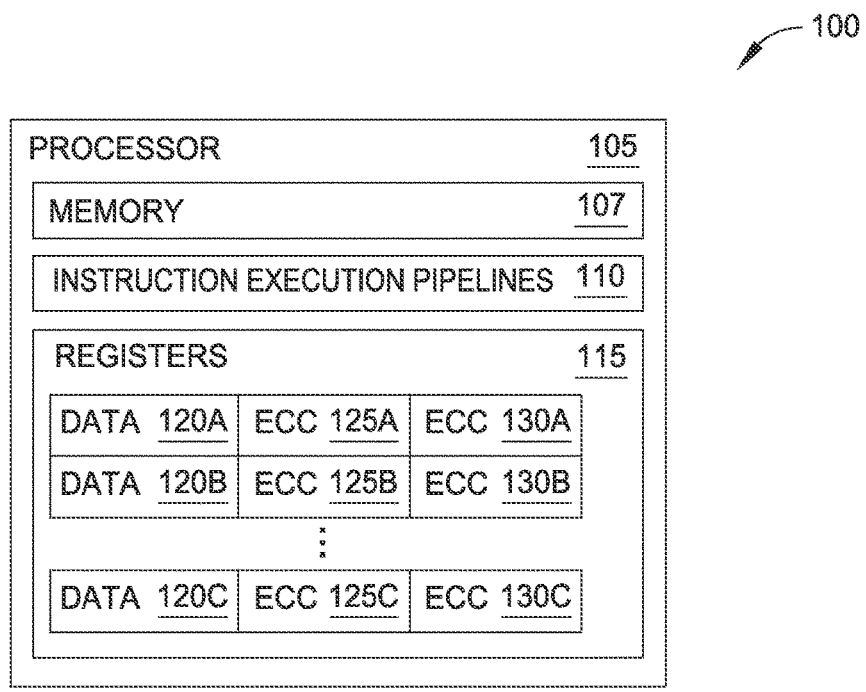
FIG. 1 illustrates a computing system for performing partial register writes, according to one embodiment described herein.

Embodiments described herein include a computing system that permits partial writes into a memory element—e.g., a register on a processor. For example, the data to be written into the memory element may be spread across multiple sources. In one embodiment, the data is organized in blocks in the memory system, but the data to be written into the memory element may span multiple blocks. The register may receive data from the two different blocks at different times and perform two separate partial write commands to store the data. For example, after storing the data from the first partial write and once the second partial write is received, the computing system may read out the data of the first partial write from the memory element, combine it with the data from the second partial write, and store the combined data in the memory element—i.e., a read-modify-write. Instead of performing the read-modify-write, embodiments described herein perform the first partial write to store a first portion of data into the memory element and the second partial write to store the remaining portion of the data.

In one embodiment, the computing system uses a byte-write mask to track which parts of the register store valid data and which do not. For example, if the first partial write includes data to be stored at bytes [5-7] of an 8 byte register, the system updates the byte-write mask to indicate the last three bytes are valid while the first five bytes are not. When the second partial write containing the remaining five bytes is received, the computing system can identify where these five bytes should be stored in the register (i.e., in the first five byte locations [0-4]) by referencing the byte-write mask. The byte-write mask can be updated to indicate that all the data stored in the register is valid. Moreover, if data is read out of the register after the first partial write is complete but before the second partial write is performed, the byte-write mask informs the computing system which portions of the data in the register is valid and which is not. Thus, by referencing the byte-write mask, the computing device can determine if the memory element stores only partial data or complete data.

One issue with performing two partial writes instead of one partial write followed by a read-modify-write is generating an ECC value for the data. When performing the read-modify-write, the data from the two partial writes are combined. During this time, the computing system can generate the ECC for the data in the memory element. However, if two partial writes are performed, then the computing system would need to retrieve the combined data to generate the ECC value representing all the stored data. But performing the additional read (and then write to store the ECC) slows down the computing system. Instead, embodiments herein generate an ECC value for each of the partial writes. That is, when storing the data of the first partial write, the computing system generates a first ECC value for the data in the first partial write and stores this value in the memory element. Later, when performing the second partial write, the computing system generates a second ECC value for this data which is also stored in the memory element. When retrieving the first and second ECC values to perform error correction, the ECC values can be combined to yield a combined ECC value for the data in both the first and second partial writes.

Furthermore, even if the computing system receives a request to read out the data in the memory element before the second partial write has been performed, the first ECC value can be used to ensure the data of the first partial write was not corrupted. For example, the computing system may use the byte-write mask to zero out the invalid bytes of the data stored in the memory element and generate a test ECC value using this combination of valid data and the additional zeros. The test ECC value can be compared to the first ECC value to ensure an error was not introduced into the data. In this manner, by calculating and storing individual ECC values for each partial write request, the computing system can perform error checking even when data from only one of the partial write requests has been loaded into the memory element.

FIG. 1 illustrates a computing system 100 for performing partial register writes, according to one embodiment described herein. The system 100 includes a processor 105 which represents one or more processing elements that each may include one or more processing cores. The processor 105 contains a memory 107 which may include volatile memory, non-volatile memory, or combinations thereof. In one embodiment, the memory 107 is a data cache or RAM for the processor 105. Moreover, although shown as being internal to the processor 105, portions of the memory 107 may be located outside the processor 105—e.g., located external to the integrated circuit or circuits that include the processor 105.

The processor 105 also includes instruction execution pipelines 110 and registers 115. The pipelines 110 represent multiple sequential steps for executing multiple computer instructions in parallel—e.g., a register load, add, copy, etc. To execute the computer instruction, the pipelines 110 may send requests to store data in, or read data from, the registers 115. As shown, each register 115 includes an individual memory element including multiple fields or entries—i.e., a data entry 120, first ECC entry 125, and second ECC entry 130. Each of these entries may have a predetermined length that defines the number of bit locations in the entries. In the examples below, it is assumed the data entry 120 stores 8 bytes (64 bits) while each of the ECC entries 125, 130 store 8 bits of data. However, this is just one example and is not intended to limit the scope of the embodiments herein. For example, other suitable lengths include 4 bytes for the data entry 120 and 4 bits for each of the ECC entries 125, 130.

In some cases, data is stored in the data entry 120 of a particular register 115 in multiple steps referred to herein as partial writes or partial write requests. In one embodiment, the processor 105 may store data in the data entry 120 using two partial write requests. For example, the data may be stored in memory 107 in blocks of data (e.g., 8, 16, or 32 kilobyte blocks). However, a request to load data from the memory 107 into one of the registers 115 may span multiple blocks. A request that spans multiple memory blocks is referred to herein as an unaligned load request. Because the memory 107 may not be able to return data from multiple blocks simultaneously, the load request is broken up into two different reads from the memory 107. For example, each of the data blocks may be stored on separate elements or memory banks in the memory 107 where only one element can be accessed at any given time. In this manner, the requested data is retrieved from the memory 107 at different times and stored in the register 115 using two partial writes.

During the first partial write, the processor 105 stores data in a first portion of the data entry 120. For instance, the data in the first partial write may include the first three bytes of the eight bytes of requested data which are stored at bytes [0-2] of the data entry 120A (where byte [0] is the most significant byte and byte [7] is the least significant byte). Later, when the remaining five bytes are received in the second partial write, the processor 105 stores this data at bytes [3-7] in the data entry 120A. As discussed later, the processor 105 may generate a byte-write mask to identify which portion of the data entry 120 stores valid data and which portion stores invalid data if only one of the partial write requests has been performed.

Instead of the first partial write including data that is written into the most significant bites of the data entry 120A, the data may be for the least significant bytes. For example, the first partial write may be intended for bytes [6-7] while the second partial write includes data for bytes [0-5]. Thus, regardless of the order in which it is received, the processor 105 can perform two partial writes to store the complete data in the data entries 120 in the registers 115 rather than using one partial write and one read-modify-write.

In addition to storing data in the data entry 120, when performing the partial writes the processor 105 generates respective ECC values that are stored in the ECC entries 125, 130. In embodiments herein, the ECC values include 8 bits where each bit corresponds to a byte stored in the data entry 120. For example, the first bits in both ECC values 125, 130 may correspond to byte [0] of the data entry 120, the second bits in the ECC values 125, 130 correspond to byte [1], and so forth. However, as will be discussed in more detail below, only one of the first bits in the ECC entries 125, 130 may be valid. For example, the first bit in ECC entry 125 may represent byte [0] in the data entry 120, while the first bit in the ECC value 130 is an invalid data bit. In contrast, the sixth bit in ECC entry 130 may represent byte [5] in the data entry 120, while the sixth bit in ECC entry 125 is an invalid data bit.

The processor 105 updates one of the ECC entries 125, 130 each time a partial write is performed. For instance, if the first partial write stored data at bytes [5-7] in the data entry 120, a corresponding ECC value for these three bytes is stored in either ECC entry 125 or ECC entry 130. When the remaining five bytes are received during the second partial write, the processor 105 calculates another ECC value for these bytes which is then stored in the unused ECC entry 125, 130.

Figure 2:
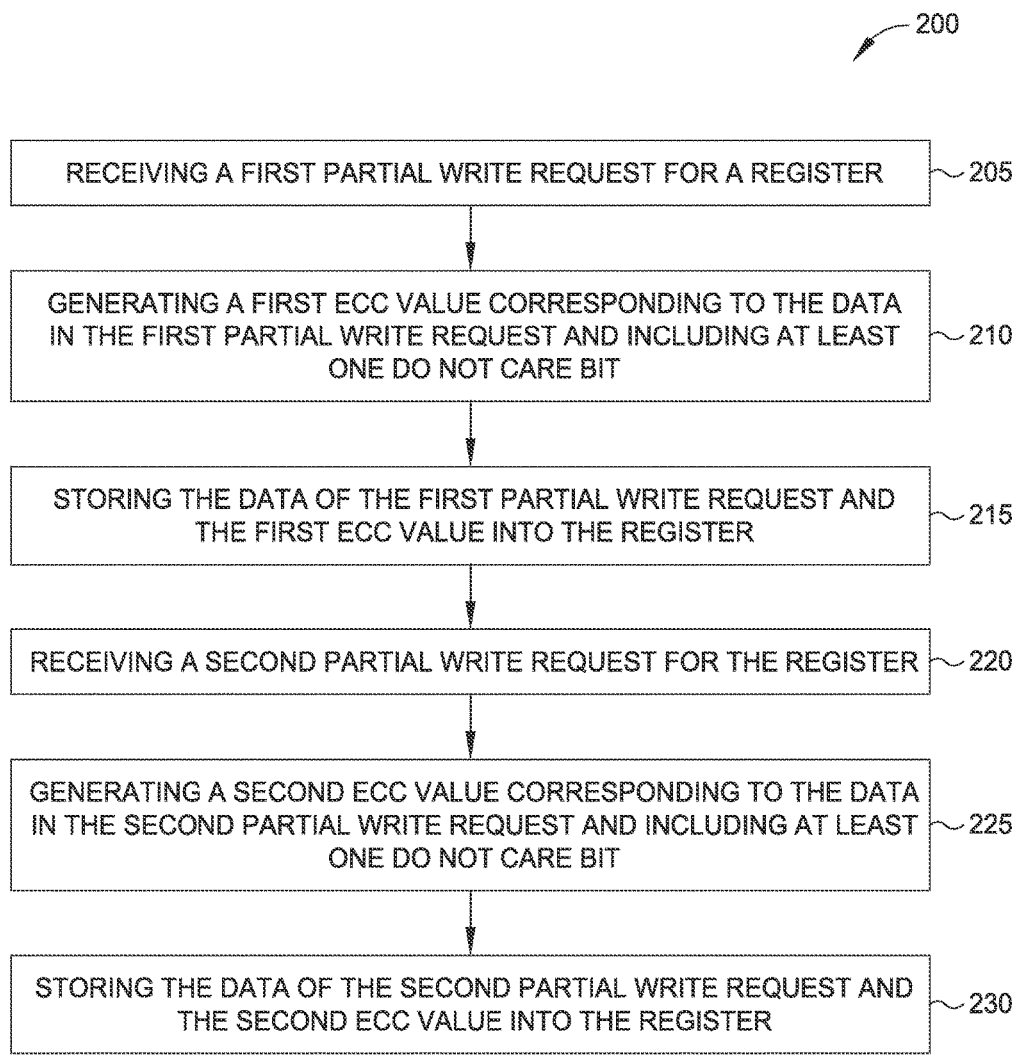
FIG. 2 is a flow chart for performing partial writes to a register, according to one embodiment described herein.

FIG. 2 is a flow chart 200 illustrating a method 200 for performing partial writes to a register, according to one embodiment described herein. For clarity, method 200 is discussed in parallel with register 300 illustrated in FIGS. 3A and 3B. At block 205, a register receives a first partial write request which includes data smaller than a storage size of the register. In one embodiment, the register includes a data entry that has a predetermined number of bit locations—e.g., 64 bits. However, the data in the first partial write request may include only a portion of the data to be stored in the register as part of, e.g., a load request. For instance, the first partial write may store one to seven bytes of the total eight bytes into the data entry of the register.

Figure 3A:
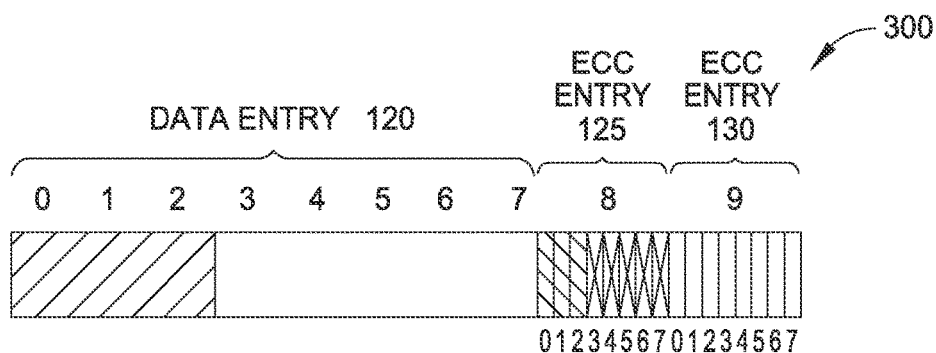
FIGS. 3A and 3B illustrate data in a register during partial writes, according to embodiments described herein.

The register 300 shown in FIG. 3A illustrates one example of performing a partial write request. The numbers 0-7 above the data entry 120 indicate that a maximum of eight bytes of data can be stored in entry 120. The numbers 0-7 below the ECC entries 125, 130 indicate that a maximum of eight bits of data can be stored in these entries. After performing block 205, the data entry 120 of register 300 includes data stored at bytes [0-2] as shown by the hatching. The remaining bytes of the data entry 120—i.e., bytes [3-7]—are invalid. These invalid bytes may include zeros, null values, or leftover data that was part of a previous write request to the register 300. In one embodiment, when storing the valid data at bytes [0-2] the processor may write zero in bytes [3-7] in parallel. However, in another embodiment, the processor may selectively write data only to bytes [0-2] while leaving the data stored at bytes [3-7] unchanged (which may be old or stale data that was stored in a previous write to the register 300).

Returning to method 200, at block 210, the processor generates a first ECC value corresponding to the data in the first partial write request. In one embodiment, the first ECC value includes at least one invalid data bit. That is, the ECC value may include eight bits where each bit corresponds to a respective byte in the data entry of the register. However, when doing a partial write, only a portion of the eight bytes is being written into the data entry, and thus, the first ECC value includes some bits that are valid and others that are invalid. As shown in FIG. 3A, the ECC value stored at ECC entry 125 has three valid bits indicated by the hashing which correspond to the three data bytes stored at locations [0-2] in the data entry 120. However, the other five bits of the ECC entry 125 are invalid data bits (which are indicated by the X's) since the remaining five bytes of the data to be stored in data entry 120 has not yet been received. However, if all the data associated with a load request was received at one time (i.e., the load request was aligned with a data block rather than unaligned), then all the bits in the first ECC entry 125 would be filled with valid bits. Stated differently, none of the bits in the ECC entry 120 would be invalid.

The particular technique used to generate the ECC values is not critical to the embodiments described herein so long as the selected technique generates ECC values that have the desired relationship with the data stored in the data entry. That is, in this example, each valid bit in the generated ECC value corresponds to a valid byte of data stored in the data entry of the register.

At block 215, the processor stores the data of the first partial write request and the first ECC value into the register. Thus, in register 300, the three most significant bytes of data entry 120 include valid data while the five least significant bytes include invalid data. Similarly, the ECC entry 125 stores the first ECC value which corresponds to the first three bytes of data in the data entry 120, while the second ECC entry 130 stores invalid data.

At block 220, the register receives a second partial write request which includes the remaining portion of the data to be stored in the register. For example, if the first partial request received at block 205 included the first three most significant bytes of the data to be stored in the register, the second partial write request includes the remaining five least significant bytes of data. Alternatively, if the first partial request included the four least significant bytes of data, the second partial request includes the four most significant bytes of data.

Figure 3B:
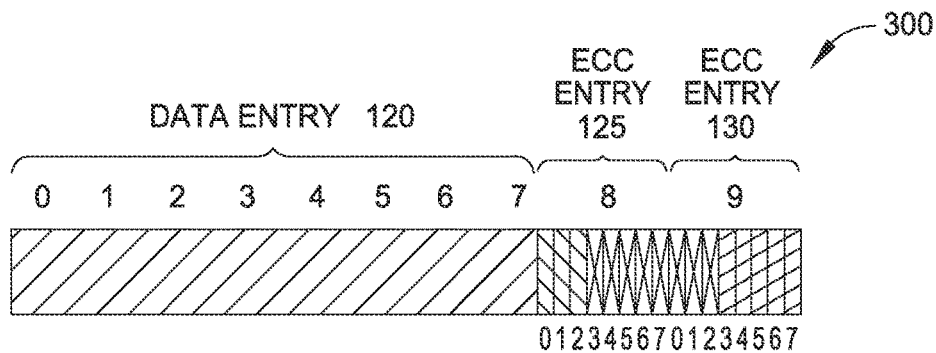

At block 225, the processor generates a second ECC value corresponding to the data in the second partial write request. Again, because the second partial write request includes only a portion of the data to be written to the data entry of the register, the second ECC value may include at least one invalid data bit. At block 230, the processor stores the data of the second partial write request and the second ECC value into the register. FIG. 3B illustrates the data stored in the register 300 after performing blocks 225 and 230 of method 200. As shown, the data entry 120 now stores eight valid bytes of data. In this example, the remaining five bytes of data are stored in bytes [3-7]. Moreover, the second ECC value generated at block 225 is stored in the ECC entry 130. Here, the bits [3-7] correspond to bytes [3-7] of the data entry 120 while bits [0-2] are invalid data bits. Although not shown, the processor may include a byte-write mask that indicates which bits in the ECC entries 125, 130 are valid and which are invalid. In one embodiment, the invalid data bits may be saved as zero bits. That is, when saving the ECC values in the entries 125, 130, the processor may place zeros in the invalid data bits.

In combination, the two ECC values stored in ECC entries 125, 130 include ECC bits for all the data stored in data entry 120. Specifically, the first three bits in ECC entry 125 correspond to bytes [0-2] while the last five bits in ECC entry 130 correspond to bytes [3-7]. As discussed later, when performing an error checking process, the data in the ECC entries 125, 130 may be combined to form a combined ECC value which then can be compared against a test ECC value generated using the data stored in bytes [0-7] in data entry 120. The combined ECC value may include only the valid bits from each of the ECC entries 125, 130 while the invalid bits are ignored or removed.

Figure 4:
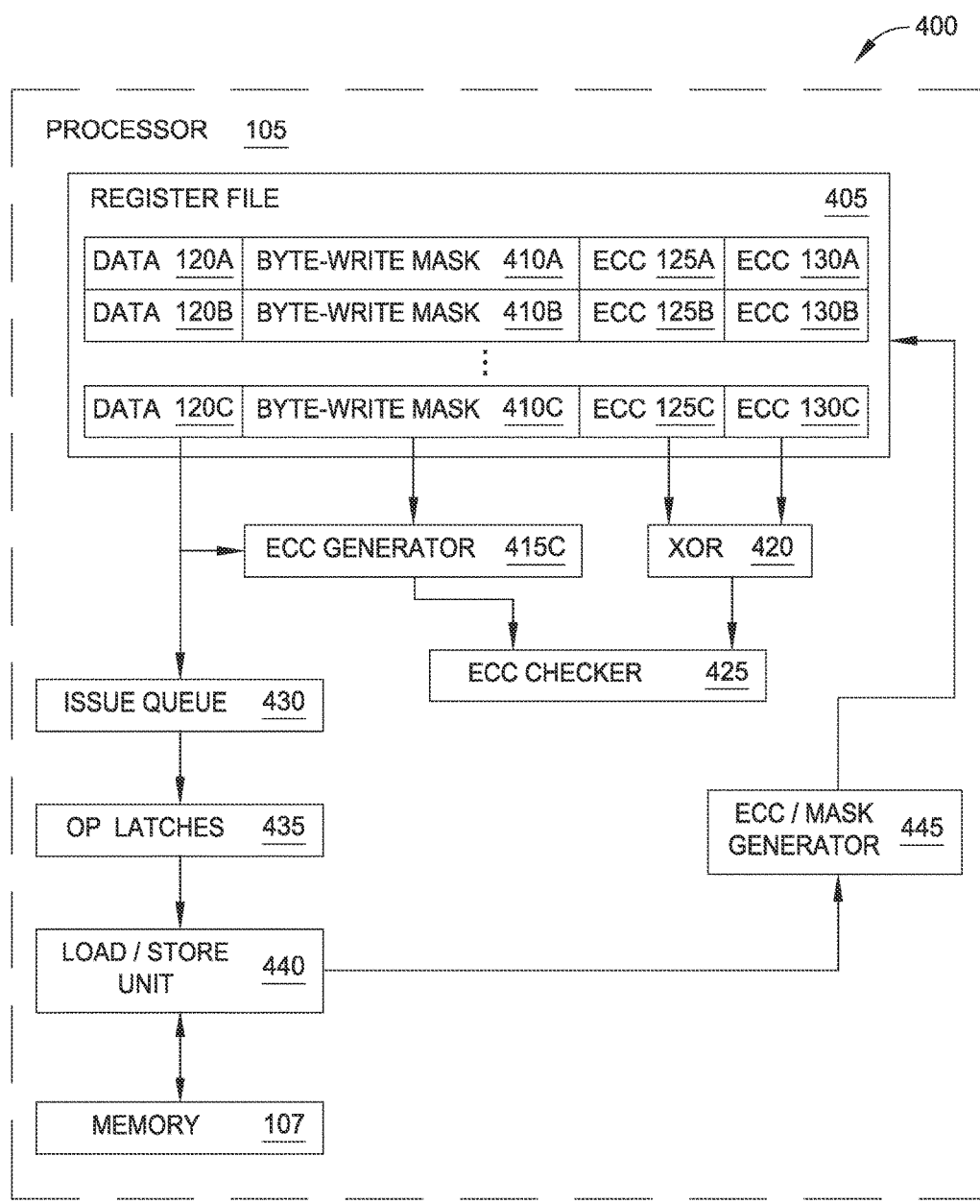
FIG. 4 illustrates a processor which performs partial writes to registers, according to one embodiment described herein.

FIG. 4 illustrates a processor 105 which performs partial writes to registers in a register file 405, according to one embodiment described herein. The register file 405 includes multiple registers that each includes a data entry 120, a byte-write mask entry 410, a first ECC entry 125, and a second ECC entry 130. The register file 405 may be a scalar register file for storing scalar data, a vector register file for storing data used in floating point operations, a history buffer that may save data previously stored in other registers so the state of the processor 105 can be saved or rolled back, and the like. The data entry 120 and the ECC entries 125, 130 have a similar function as the entries discussed above and will not be repeated here. The byte-write mask entry 410 stores a mask value where each bit in the mask value indicates whether a corresponding byte in the data entry 120 is valid. For example, if only the last two bytes in the data entry 120 are valid, the last two bits in the mask value may be ones while the first six bits in the mask are zeros. Thus, by evaluating the mask value stored in the byte-write mask entry 410, the processor 405 can identify whether only partial data has been written into the data entry 120, and if so, which bytes of the data entry 120 include valid data and which include invalid data.

The processor 105 includes a load/store unit 440, ECC/mask generator 445, and memory 107 which are used to store data in the register file 405. For example, a thread executing in a pipeline of the processor 105 (not shown) may send an instruction to the load/store unit 440 to load a particular value into the register file 405. To do so, the load/store unit 440 receives the data from the memory 107 which may include a cache memory on the processor or memory elements external to the processor 105—e.g., RAM or a hard disk. As discussed above, the requested data may be a chunk of data (e.g., 64 bytes) that spans multiple blocks of memory 107—i.e., the requested data is part of an unaligned load request. As a result, the requested data is stored into a register using multiple partial writes. However, if the requested data is located in one block of data, then the load/store unit 440 may send only one write instruction to the register file 405.

Assuming the requested data spans multiple blocks of data, the load/store unit 440 receives the partial data at two different times and forwards this data to the ECC/mask generator 445 which generates an ECC value for each of the partial writes. When performing the first partial write, the ECC generator 445 generates a first ECC value for the corresponding data which is stored in the ECC entry 125. Moreover, the ECC/mask generator 445 generates a mask value stored in the byte-write mask entry 410. In this example, if the first partial write stores the first three bytes of data into the register, the mask value indicates that the first three bytes of the data entry 120 are valid while the remaining five bytes are invalid. In one embodiment, the mask value is generated using information provided by the load/store unit 440. The load/store unit 440 may provide a three bit number that informs the ECC/mask generator 445 of the boundary between the partial writes as well as left/right indicator. For example, a boundary value of three (i.e., 011) indicates that the two partial writes divide the data into bytes [0-2] and bytes [3-7]. The left/right indicator tells the ECC/mask generator 445 whether the current partial data is the most significant (left) sub-portion (e.g., bytes [0-2]) or the least significant (right) sub-portion (e.g., bytes [3-7]). Based on this information, the ECC/mask generator can generate the mask value and store the data correctly into the data entry 120.

Later, when performing a second partial write, the ECC generator 445 generates a second ECC value for the remaining data (e.g., the remaining five of the eight bytes of data) which is stored in the ECC entry 130. The ECC/mask generator 445 may also update the mask value in the mask entry 410 to indicate that all eight bytes in the data entry 120 are valid.

The processor 105 may request to read data from one of the registers in the register file 405 that is then transmitted to an issue queue 430. The data may be read from the register either after one of the two partial writes has been performed or after all of the partial writes have been performed. When reading data from a particular register in the register file 405, the processor 105 performs an error correction check to make sure the data has not been corrupted. For example, alpha particles or background radiation may cause one or more of the bits in the registers to flip. By performing the error check, the processor 105 can mitigate and correct these errors in the data.

If only one partial write has been performed, only one of the ECC entries 125, 130 contains an ECC value corresponding to data stored in the data entry 120. For example, the first ECC entry 125A may contain an ECC value for six bytes in the data entry 120A while the second ECC entry 130A may store all zeros (which may have been stored in entry 130A when the ECC/mask generator 445 updated the first ECC entry 125A). The processor 105 combines the ECC entries 125A, 130A to yield a combined ECC value. In this case, because xoring any value with zeros results in the original value, the combined ECC value is the value stored in the first ECC entry 125A. Using the information in the byte-write mask entry 410, an ECC generator 415 determines the valid bits stored in the data entry 120A (e.g., the six valid bytes) and generates a test ECC value for these bytes. Stated differently, the mask value in the mask entry 410 informs the ECC generator 415 which data in the data entry 120A is valid and which data is invalid, and thus, should be ignored. In one embodiment, the ECC generator 415 replaces the invalid bits with zeros before calculating the test ECC value. An ECC checker 425 compares the combined ECC value outputted by the XOR logic 420 with the test ECC value outputted by the ECC generator 415. If there is a match, the data in the register is deemed valid and stored in the issue queue 430. If not, the processor 105 may perform error correction to mitigate or correct the errors which will not be discussed in detail in this disclosure.

If all of the partial writes have been performed before the data is read out, both ECC entries 125, 130 contain valid ECC entries (which each may include one or more invalid data bits). In this embodiment, the invalid bits are zeros. For example, the first six bits in the ECC entry 125 may be valid while the last two bits are zero. Conversely, the first six bits of the ECC entry 130 are zeros while the last two bits are valid. Thus, when combined by the XOR logic 420, the result is a combined ECC entry with eight valid bits—six bits defined by the first six bits in the ECC entry 125 and two bits defined by the last two bits in the ECC entry 130. Moreover, the mask value in the mask entry 410 indicates that all the data in the data entry 120 is valid, and thus, the ECC generator 415 generates the test ECC value using all the data in the entry 120. If the test ECC value matches the combined ECC value outputted by the XOR logic 420, the data stored in the register is deemed valid and is forwarded to the issue queue 430.

In one embodiment, the issue queue 430 does not forward the data read out from the register file 405 until all the data is received. That is, if the register file 405 stores the data from only one partial write operation, the queue 430 waits until the second partial write is received by the register file 405 and then transmitted to the issue queue 430. For example, the issue queue 430 may include a snooping operation that monitors the write request into the register file 405 to determine when the other write operation has been performed and can be read out.

Once the data is received, the issue queue 430 forwards the data to operand (OP) latches 435 that store the received data as operands for processor instructions. For example, the OP latches 435 may store the result of performing an add or multiply instruction. The OP latches 435 forwards the operand data to the load/store unit 440 which may transmit the data to the memory 107.

Figure 5:
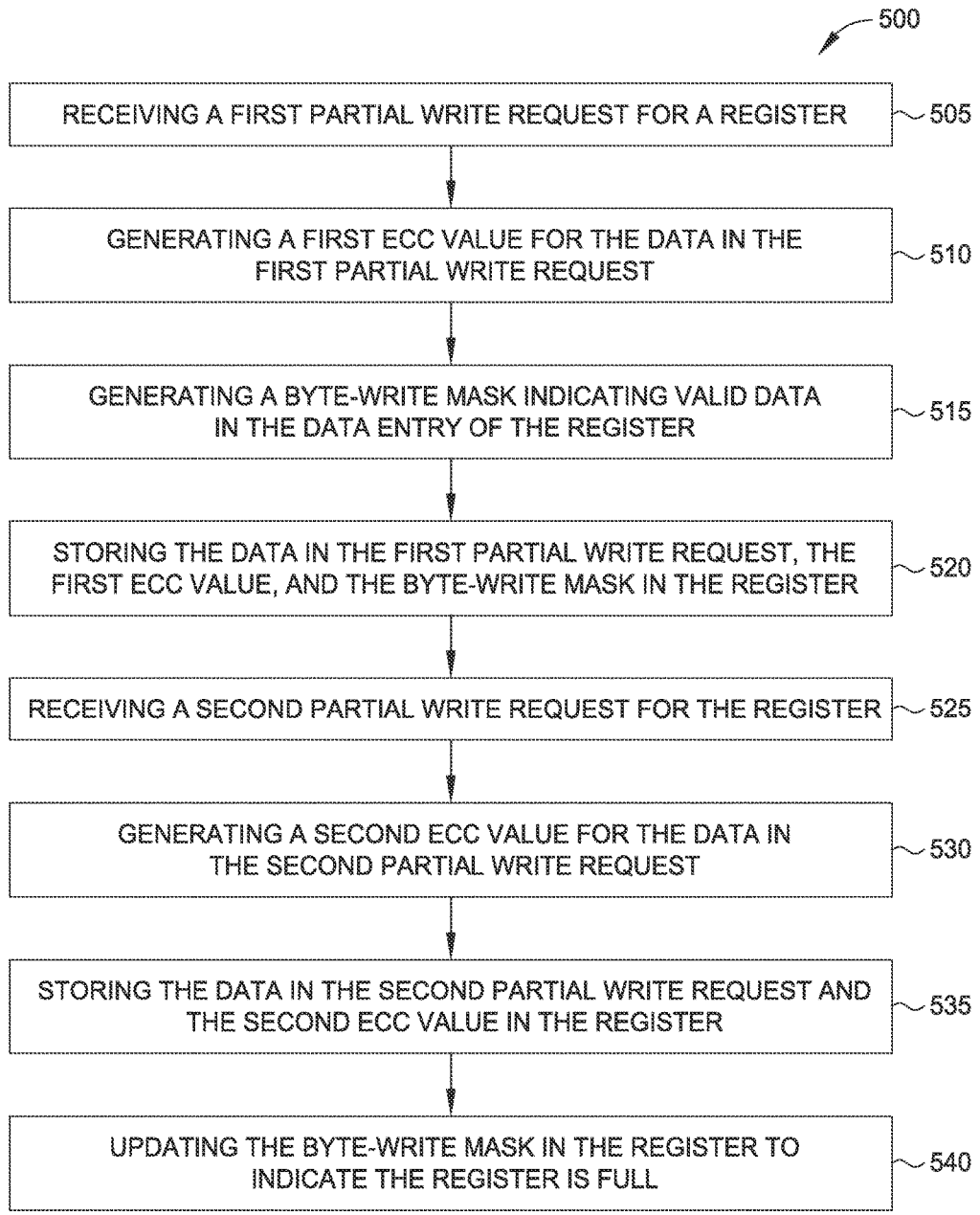
FIG. 5 is a flow chart for performing partial writes to a register, according to one embodiment described herein.

FIG. 5 is a flow chart 500 for performing partial writes to a register, according to one embodiment described herein. For clarity, method 500 is discussed in parallel with a register 600 illustrated in FIGS. 6A and 6B. At block 505, the load/store unit receives a first partial write request for a register in a register file. That is, the load/store unit may receive only a portion of the data from memory which is to be written into the register. Instead of waiting for the remaining portion of data, the processor proceeds to store the partial data in the register.

Figure 6A:
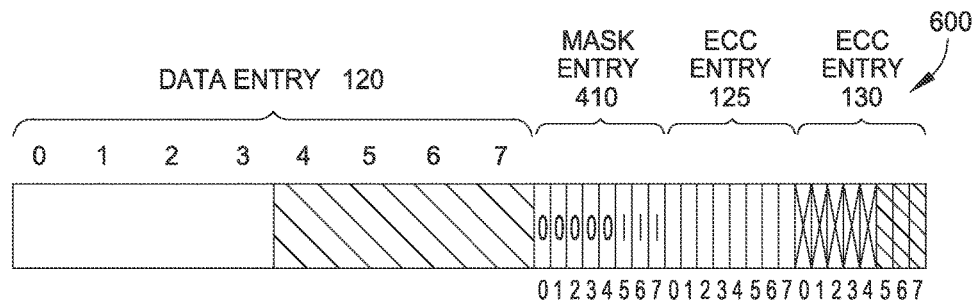
FIGS. 6A and 6B illustrate data in a register during partial writes, according to one embodiment described herein.

At block 510, the processor generates a first ECC value for the data in the first partial write request. As shown in FIG. 6A, the first partial write request contains the three least significant bytes [5-7]. Like in FIGS. 3A and 3B, the numbers 0-7 above the data entry 120 represent bytes of data while the numbers 0-7 below the mask entry 410 and ECC entries 125, 130 represent bits of data. The processor generates a first ECC value that is stored in ECC entry 130. The first five bits of the first ECC value are invalid data bits, and in one embodiment, are zeros. The last three bits, however, contain valid ECC bit values that each correspond to a respective one of the bytes [5-7] in data entry 120. Moreover, although the first ECC value was stored in ECC entry 130, it is also possible to store this value in ECC entry 125. So long as the data is stored the same way—e.g., the leftmost five bits are zeros and the rightmost three bits are valid data—when combined with the data in the other ECC entry, the resulting combined ECC value is the same.

At block 515, the processor generates a byte-write mask indicating valid data in the data entry of the register. For example, when receiving partial data, a load/store unit may provide a boundary byte and a left/right indicator that inform the mask generator if the partial data is the least significant portion or the most significant portion of the data to be stored in the register. In the example shown in FIG. 6A, the partial data is the least significant portion and includes bytes [5-7]. As such, the mask stored in the mask entry 410 has zeros stored in bits 0-4 which indicates bytes [0-4] of data entry 120 are invalid and ones stored in bits 5-7 indicating bytes [5-7] of entry 120 are valid.

At block 520, the processor stores the data in the first partial write request, the first ECC value, and the byte-write mask in the register. As shown in FIG. 6A, the bytes [0-4] in data entry 120 and the ECC entry 125 do not store valid data. In one embodiment, these portions of the register 600 may store null values or be zeroed out when the valid data is stored. Alternatively, these portions may continue to store previous data that was loaded into the register 600 during a previous write request.

At block 525, the load/store unit receives a second partial write request for the register. In one embodiment, the second partial write request contains the remaining data for the data entry in the register. However, the embodiments herein are not limited to two partial writes and instead may use three or four partial writes to fill a data entry in a register. In these embodiments, the register may include additional ECC entries for accommodating ECC values for each of the partial writes.

Figure 6B:
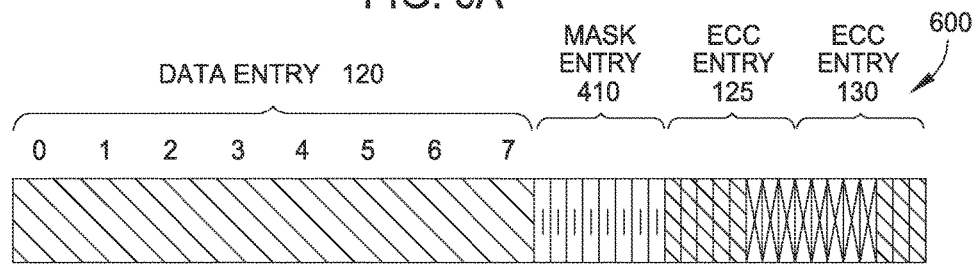

At block 530, the processor generates a second ECC value for the data in the second partial write request. As shown in FIG. 6B, the second ECC value is stored in ECC entry 125 and includes five valid bits—i.e., bits 0-4 which correspond to bytes [0-4] in data entry 120. The last remaining bits in the ECC entry 125—i.e., bits 5-7—are invalid data bits and do not correspond to the data in the data entry 120. As mentioned above, these bits may be zeros.

At block 535, the processor stores the data in the second partial write request and the second ECC value in the register. As illustrated in FIG. 6B, the data entry 120 is now full and contains eight bytes of valid data. That is, the processor replaces the invalid data at bytes [0-4] shown in FIG. 6A with valid data received in the second partial write request. In addition, the ECC entry 125 now includes the ECC values for the five bytes of data written during the second write request.

At block 540, the processor updates the byte-write mask in the register to indicate the register is full. In FIG. 6B, the mask entry 410 now stores all ones which indicate that each byte in the data entry 120 stores valid data and that the data entry 120 is full. As discussed below, the byte-write mask in the mask entry 410 can be used to perform error checking when data is read from the register 600.

Figure 7:
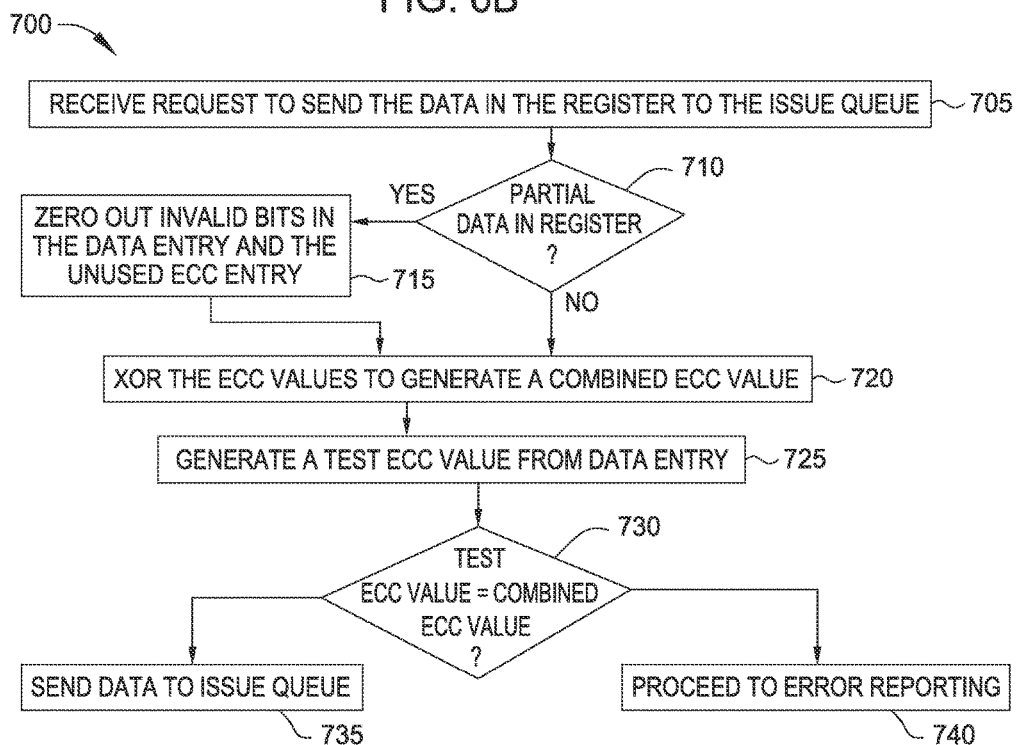
FIG. 7 is a flow chart for error checking data stored in a register, according to one embodiment described herein.

FIG. 7 is a flow chart illustrating a method 700 for error checking data stored in a register, according to one embodiment described herein. At block 705, the register receives a request to send its data to the issue queue. At block 710, the processor determines if the register stores only partial data—e.g., less than 64 bytes of valid user data. To do so, the processor may evaluate the byte-write mask stored in the register. Referring to FIG. 6A, because a one in the mask entry 410 represents a valid byte in the data entry 120 and a zero indicates an invalid byte, the processor can read this data to determine if only one of the partial writes has been performed. If any of the bits in the mask are zero, the processor can determine that only one of the partial writes has been performed.

If only partial data is written in the data entry of the register, method 700 proceeds to block 715 where the invalid bits in the data entry and the unused ECC entry are zeroed out when retrieved from the register. Using FIG. 6A as an example, when the eight bytes of data entry 120 are retrieved from the register 600, the processor may replace whatever data is stored at bytes [0-4] with zeros. Similarly, the processor can retrieve the data stored in the ECC entry 125 and zero out this data (if the data stored at entry 125 does not already store all zeros). However, the data actually stored in the data entry 120 and the mask entry 410 may remain unchanged. That is, the processor may include logic that alters the data retrieved from the entries 120, 410 while leaving the data stored in register 600 unchanged.

At block 720, the ECC value in ECC entry 130 is xored with all zeros corresponding to the ECC entry 125. Thus, the resulting combined ECC value is simply a copy of the data stored in ECC entry 130 since xoring any bit combination with zeros results in the same bit combination. Moreover, because xoring the ECC value in ECC entry 130 with zeros does not change the ECC value, in one embodiment, the processor may skip block 720 after determining only a partial write was performed and use the ECC value in ECC entry 130 as the combined ECC entry.

However, if at block 710 the processor determines using the byte-write mask that the register stores complete data (e.g., the data entry is full), at block 720, the ECC values in the two ECC entries are xored to yield the combined ECC value. Referring to FIG. 6B, by xoring the ECC value in entries 125, 130, the invalid bits are removed. For example, the invalid bits in the ECC entries 125, 130 may be zeros. Thus, when the zero stored at bit 0 of ECC entry 130 is xored with the valid bit at bit 0 of ECC entry 125, the result is that the valid bit of ECC entry 125 becomes bit 0 of the combined ECC value. After performing the XOR operation, bits 0-4 of the combined ECC value are the same as bits 0-4 in the ECC entry 125, while bits 5-7 of the combined ECC value are the same as bits 5-7 of the ECC entry 130. Thus, the combined ECC value has the same bit length as the ECC values stored in entries 125, 130.

At block 725, the processor generates a test ECC value from the data retrieved from the data entry. In the case of a partial write, the test ECC value is generated using the valid data along with the zeros that were added at block 715. If the data entry is full with valid data, however, the test ECC value is generated using the 8 bytes of valid data without replacing invalid data with zeros.

At block 730, the processor compares the test ECC value with the combined ECC value. Referring to FIG. 6A when only one partial write has been performed, the processor generates the test ECC value using zeros at byte locations [0-4] and the valid data at byte locations [5-7]. Because the same technique may be used to generate the test ECC value and the ECC values stored in the entries 125, 130, bits 5-7 of the test ECC value should match bits 5-7 of the combined ECC value—i.e., bits 5-7 stored in the ECC entry 130. Referring to FIG. 6B when both partial writes have been performed, the test ECC value is generated using the eight bytes in data entry 120, and thus, include eight valid bits, each one corresponding to one of the eight bytes. The processor compares the eight bits in the test ECC value to the eight valid bits in the combined ECC value to determine if they match.

If a bit was flipped in the valid bits of either the data entry 120 or the ECC entries 125, 130, the test ECC value and the combined ECC value may not match. In response, method 700 proceeds to block 740 where error reporting is performed and the processor may attempt to identify and correct the flipped bit. If there is a match, however, method 700 proceeds to block 735 where the data stored in the data entry is sent to the issue queue. Since the data only includes a partial write, the issue queue may delay forwarding the data until the remaining portion is received.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising:
   a memory comprising a plurality of registers, each register comprising:
      a data entry,
      a first error correction code (ECC) entry, and
      a second ECC entry; and
   logic configured to:
      in response to receiving a first partial write request:
         generate a first ECC value using data in the first partial write request, wherein at least one of a plurality of bits of the first ECC value is an invalid data bit, and
         store, in a first register of the plurality of registers, (i) the first ECC value in the first ECC entry and (ii) the data of the first partial write request in the data entry, wherein the data of the first partial write request only partially fills the data entry, and
      in response to receiving a second partial write request:
         generate a second ECC value using data in the second partial write request, wherein at least one of a plurality of bits of the second ECC value is an invalid data bit, and
         store, in the first register, (i) the second ECC value in the second ECC entry and (ii) the data of the second partial write request in the data entry, wherein performing the first and second partial write requests fills the data entry without performing a read-modify-write.

2. The integrated circuit of claim 1, wherein valid bits of the plurality of bits of the first ECC value each correspond to a respective byte of the data in the first partial write request, and valid bits of the plurality of bits of the second ECC value each correspond to a respective byte of the data in the second partial write request.

3. The integrated circuit of claim 1, wherein the first ECC value has a total number of invalid bits that is different than a total number of invalid bits in the second ECC value.

4. The integrated circuit of claim 1, further comprising a processor, wherein the memory comprises a register file within the processor.

5. An integrated circuit, comprising: a memory comprising a plurality of registers, each register comprising:
   a data entry,
   a first ECC entry, and
   a second ECC entry; and
   logic configured to:
      in response to receiving a first partial write request, store, in a first register of the plurality of registers, (i) a first ECC value generated using data in the first partial write request in the first ECC entry and (ii) the data of the first partial write request in the data entry, wherein the data of the first partial write request only partially fills the data entry,
      in response to receiving a second partial write request, store, in the first register, (i) a second ECC value generated using data in the second partial write request in the second ECC entry and (ii) the data of the second partial write request in the data entry, wherein performing the first and second partial write requests fills the data entry without performing a read-modify-write,
      in response to receiving a request to read the data entry of the first register, determine if the data entry is partially full, and
      upon determining the data entry is partially full, generate a combined ECC value by XORing the first ECC value with the second ECC value, wherein one of the first and second ECC values is filled with zeros.

6. The integrated circuit of claim 5, wherein the logic is configured to:
   in response to the request to read the data entry of the first register, generate a test ECC value based on data stored in the data entry; and
   compare the test ECC value to the combined ECC value.

7. A computer program product for managing a memory comprising a plurality of registers, each register comprising a data entry, a first ECC entry, a second ECC entry, and a mask entry, the computer program product comprising:
   a computer-readable storage medium having computer-readable program code embodied therewith, the computer-readable program code executable by one or more computer processors to:

in response to receiving a first partial write request:
    generate a first ECC value using data in the first partial write request, wherein at least one of a plurality of bits of the first ECC value is an invalid data bit, and
    store, in a first register of the plurality of registers, (i) the first ECC value in the first ECC entry and (ii) the data of the first partial write request in the data entry, wherein the data of the first partial write request only partially fills the data entry, and
in response to receiving a second partial write request:
    generate a second ECC value using data in the second partial write request, wherein at least one of a plurality of bits of the second ECC value is an invalid data bit, and
    store, in the first register, (i) the second ECC value in the second ECC entry and (ii) the data of the second partial write request in the data entry, wherein performing the first and second partial write requests fills the data entry without performing a read-modify-write.

8. The computer program product of claim 7, wherein valid bits of the plurality of bits of the first ECC value each correspond to a respective byte of the data in the first partial write request, and valid bits of the plurality of bits of the second ECC value each corresponds to a respective byte of the data in the second partial write request.

9. The computer program product of claim 7, wherein the first ECC value has a total number of invalid bits that is different than a total number of invalid bits in the second ECC value.

10. The computer program product of claim 7, wherein the computer-readable program code is further executable to:
    in response to receiving a request to read the data entry of the first register, determine if the data entry is partially full,
    upon determining the data entry is partially full, generate a combined ECC value by XORing the first ECC value with the second ECC value, wherein one of the first and second ECC values is filled with zeros.

11. The computer program product of claim 10, wherein the computer-readable program code is further executable to:
    in response to the request to read the data entry of the first register, generate a test ECC value based on data stored in the data entry; and
    compare the test ECC value to the combined ECC value.

* * * * *